(12) United States Patent
Graef

(10) Patent No.: US 6,598,213 B1
(45) Date of Patent: Jul. 22, 2003

(54) STATIC TIMING ANALYSIS VALIDATION TOOL FOR ASIC CORES

(75) Inventor: Stefan Graef, Milpitas, CA (US)

(73) Assignee: LSI Logic Corporation, Milpitas, CA (US)

(*) Notice: Subject to any disclaimer, the term of this patent is extended or adjusted under 35 U.S.C. 154(b) by 272 days.

(21) Appl. No.: 09/836,129

(22) Filed: Apr. 16, 2001

(51) Int. Cl.[7] .............................................. G06F 17/50
(52) U.S. Cl. ................... 716/6; 716/4; 716/5
(58) Field of Search ...................... 716/4, 5, 6; 326/41, 326/47, 101

(56) References Cited

U.S. PATENT DOCUMENTS

| | | | |
|---|---|---|---|
| 6,131,182 A | * 10/2000 | Beakes et al. .................. 716/8 |
| 6,184,711 B1 | * 2/2001 | Graef et al. ................... 326/41 |
| 6,286,126 B1 | * 9/2001 | Raghavan et al. ............. 716/6 |
| 6,363,516 B1 | * 3/2002 | Cano et al. .................... 716/5 |
| 6,378,109 B1 | * 4/2002 | Young et al. .................. 716/4 |
| 6,446,239 B1 | * 9/2002 | Markosian et al. ............ 716/2 |
| 6,499,131 B1 | * 12/2002 | Savithri et al. ................ 716/5 |

OTHER PUBLICATIONS

Mark Basel, Ph. D., "Accurate and Efficient Extraction of Interconnect Circuits for Full–Chip Timing Analysis," IEEE, 1997, pp. 118–123.*

Huang et al., "Improving the Accuracy of On–Chip Parasitic Extraction," IEEE, 1997, pp. 42–45.*

Ferreira et al., "Lasca—Interconnect Parasitic Extraction Tool for Deep–Submicron IC Design," IEEE, 2000, pp. 327–332.*

* cited by examiner

Primary Examiner—Vuthe Siek
(74) Attorney, Agent, or Firm—Fitch, Even, Tabin & Flannery

(57) ABSTRACT

A method of characterizing worst case timing performance includes the steps of receiving as input a netlist of a core, performing a parasitic extraction on the netlist to generate a first standard parasitic extraction format file for a first assumed top metal layer over the core, performing a parasitic extraction on the netlist to generate a second standard parasitic extraction format file for a second assumed top metal layer over the core, calculating a minimum timing value from each delay arc of the first standard parasitic extraction format file, calculating a maximum timing value from each delay arc of the second standard parasitic extraction format file, and merging the minimum timing value calculated from each delay arc of the first standard parasitic extraction format file and the maximum timing value of each delay arc calculated from the second standard parasitic extraction format file to generate an output file.

16 Claims, 3 Drawing Sheets

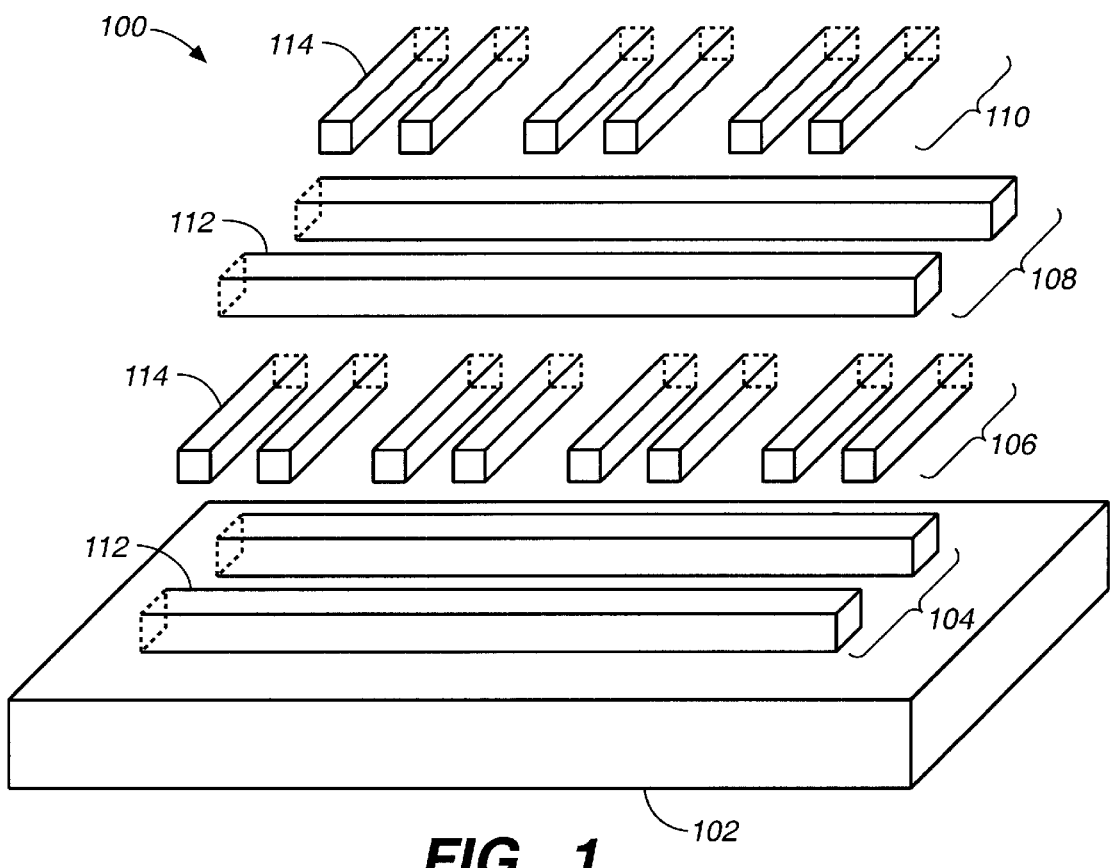
FIG._1
*(PRIOR ART)*
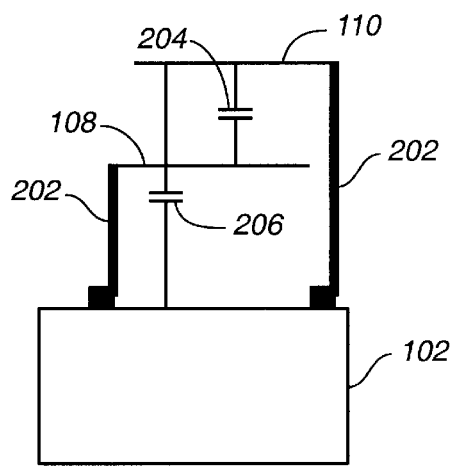
FIG._2
*(PRIOR ART)*

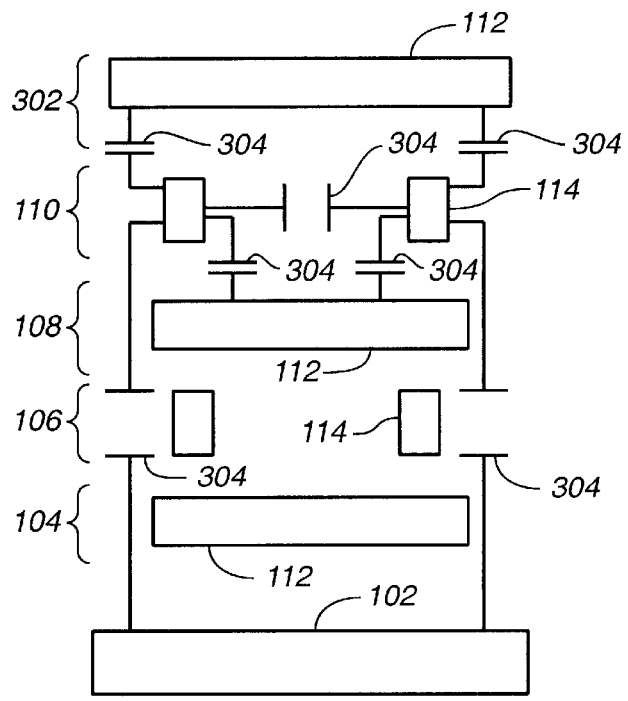
FIG._3
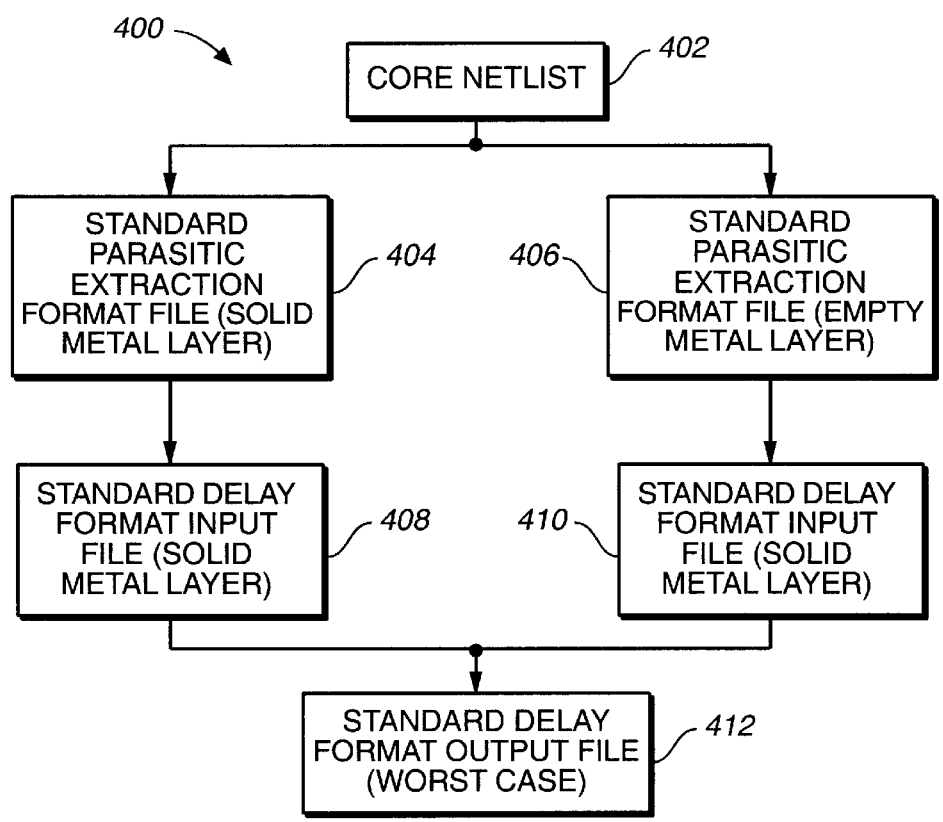
FIG._4

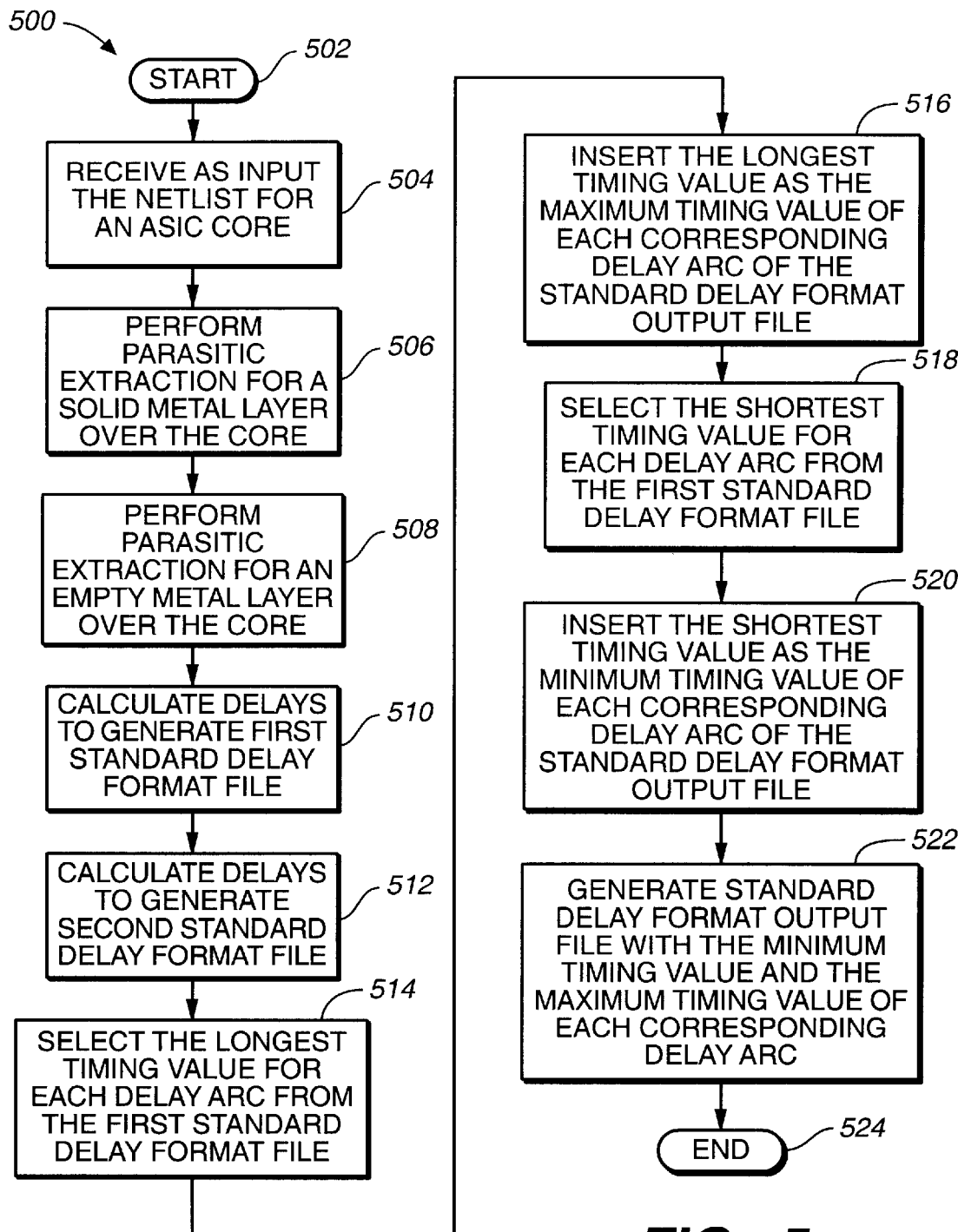
FIG._5

STATIC TIMING ANALYSIS VALIDATION TOOL FOR ASIC CORES

BACKGROUND OF THE INVENTION

The present invention relates generally to design tools for application-specific integrated circuit integrated circuit (ASIC) design. More specifically, but without limitation thereto, the present invention relates to a method for characterizing the worst case performance of an ASIC core due to capacitive coupling between the ASIC core and metal interconnect layers.

A core is a pre-defined group of circuit elements and modules connected together to perform a specific function. Cores are provided as part of an ASIC design technology library that is used by a circuit designer to implement a specific circuit design. The operation of a core may be significantly influenced by its environment, especially by capacitive coupling between the core and interconnects that are routed in metal layers above the core.

SUMMARY OF THE INVENTION

The present invention advantageously addresses the problems above as well as other problems by providing a method of characterizing worst case timing performance for an ASIC core that may be included in a library for use with logic design tools.

In one embodiment, the present invention may be characterized as a method of characterizing worst case timing performance that includes the steps of receiving as input a netlist of a core, performing a parasitic extraction on the netlist to generate a first standard parasitic extraction format file for a first assumed top metal layer over the core, performing a parasitic extraction on the netlist to generate a second standard parasitic extraction format file for a second assumed top metal layer over the core, calculating a minimum timing value from each delay arc of the first standard parasitic extraction format file, calculating a maximum timing value from each delay arc of the second standard parasitic extraction format file, and merging the minimum timing value calculated from each delay arc of the first standard parasitic extraction format file and the maximum timing value of each delay arc calculated from the second standard parasitic extraction format file to generate an output file.

In another embodiment, the present invention may be characterized as a method of characterizing worst case timing performance that includes the steps of receiving as input a netlist of a core, performing a parasitic extraction on the netlist to generate a first standard parasitic extraction format file for a first assumed top metal layer over the core, performing a parasitic extraction on the netlist to generate a second standard parasitic extraction format file for a second assumed top metal layer over the core, performing a delay calculation on the first standard parasitic extraction format file to generate a first standard delay format file, performing a delay calculation on the second standard parasitic extraction format file to generate a second standard delay format file, selecting a longest timing value for each delay arc from the first standard delay format file, inserting the longest timing value for each delay arc from the first standard delay format file into a maximum timing value of each corresponding delay arc of an output file, selecting a shortest timing value for each delay arc from the second standard delay format file, inserting the shortest timing value for each delay arc from the second standard delay format file into a minimum timing value of each corresponding delay arc of the output file, and generating as output the minimum timing value and the maximum timing value of each corresponding delay arc of the output file in standard delay format.

In yet another embodiment, the present invention may be characterized as a computer program product that includes a medium for embodying a computer program for input to a computer and a computer program embodied in the medium for causing the computer to perform the following functions: receiving as input a netlist of a core, performing a parasitic extraction on the netlist to generate a first standard parasitic extraction format file for a first assumed top metal layer over the core, performing a parasitic extraction on the netlist to generate a second standard parasitic extraction format file for a second assumed top metal layer over the core, selecting a longest timing value for each delay arc from the first standard delay format file, inserting the longest timing value for each delay arc from the first standard delay format file into a maximum timing value of each corresponding delay arc of an output file, selecting a shortest timing value for each delay arc from the second standard delay format file, inserting the shortest timing value for each delay arc from the second standard delay format file into a minimum timing value of each corresponding delay arc of the output file, and generating as output the minimum timing value and the maximum timing value of each corresponding delay arc of the output file in standard delay format.

BRIEF DESCRIPTION OF THE DRAWINGS

The above and other aspects, features and advantages of the present invention will be more apparent from the following more specific description thereof, presented in conjunction with the following drawings wherein:

FIG. 1 is an exploded diagram of an ASIC core of the prior art;

FIG. 2 is a diagram illustrating capacitive loading between metal layers and silicon in the ASIC core of FIG. 1;

FIG. 3 is a diagram illustrating capacitive coupling between metal layer interconnects and silicon in the ASIC core of FIG. 1;

FIG. 4 is a diagram illustrating data flow for a method of characterizing worst case timing performance according to an embodiment of the present invention; and FIG. 5 is a flowchart of the method illustrated in FIG. 4 that may be embodied in a computer program and implemented by a computer.

Corresponding reference characters indicate corresponding elements throughout the several views of the drawings.

DETAILED DESCRIPTION OF THE DRAWINGS

The following description is presented to disclose the currently known best mode for making and using the present invention. The scope of the invention is defined by the claims.

FIG. 1 is an exploded diagram of an application-specific integrated circuit (ASIC) core 100 of the prior art. Shown in FIG. 1 are a silicon layer 102, a first metal layer 104, a second metal layer 106, a third metal layer 108, a fourth metal layer 110, horizontal wires 112, and vertical wires 114.

The silicon layer 102 contains the transistors and other discrete components of the ASIC core 100. Each of the metal layers 104, 106, 108, and 110 contain the horizontal wires 112 and the vertical wires 114.

The capacitance of the horizontal wires 112 and the vertical wires 114 strongly influences the delays of the gates that the horizontal wires 112 and the vertical wires 114 are driven by. More capacity on a wire results in longer gate delay; less capacitance results in shorter gate delay. The capacitance of a wire is determined in part by the proximity to neighboring metal layers and the silicon layer 102 as shown in FIG. 2.

FIG. 2 is a diagram 200 illustrating capacitive loading between metal layers and silicon in the ASIC core of FIG. 1. Shown in FIG. 2 are the silicon layer 102, the third metal layer 108, the fourth metal layer 110, vias 202, metal layer to metal layer capacitance 204, and metal layer to silicon layer capacitance 206.

The metal layer to silicon layer capacitance 206 is fairly independent of the neighboring horizontal wires 112 and the vertical wires 114, whereas the metal layer to metal layer capacitance 204 is strongly dependent on the neighboring horizontal wires 112 and the vertical wires 114. The capacitance of one of the vertical wires 114 in the fourth metal layer 110, for example, cannot be accurately determined due to the unknown capacitance of a top metal layer that is typically added when the ASIC core 100 is implemented in a chip design.

FIG. 3 is a diagram 300 illustrating capacitive coupling between metal layer interconnects and silicon in the ASIC core 100 of FIG. 1. Shown in FIG. 3 are a silicon layer 102, a first metal layer 104, a second metal layer 106, a third metal layer 108, a fourth metal layer 110, horizontal wires 112, vertical wires 114, a fifth metal layer 302, and interconnect capacitances 304.

The addition of the fifth metal layer 302 introduces the capacitances 304 between the fifth metal layer 302 and each of the vertical wires 114 in the fourth metal layer 110. Without prior knowledge of the capacitances 304 introduced by the fifth metal layer 302, an accurate timing performance analysis of the ASIC core 100 in an ASIC design is not practical using previous methods for static timing analysis. A practical method for characterizing the timing performance of the ASIC core 100 to anticipate timing problems in any ASIC design generates a standard delay format file for worst case analysis as illustrated in FIG. 4.

FIG. 4 is a diagram 400 illustrating data flow for a method of characterizing worst case timing performance. Shown in FIG. 4 are a core netlist 402 for the ASIC core 100, a first standard parasitic extraction format file for a solid top metal layer 404, a second standard parasitic extraction format file for an empty top metal layer 406, a standard delay format input file for a solid top metal layer 408, a standard delay format input file for an empty top metal layer 410, and a standard delay format output file for the worst case 412.

The core netlist 402 may be generated by standard logic tool design software according to well known techniques. A first parasitic extraction is performed on the core netlist 402 to generate the first parasitic extraction format (SPEF) file 404 using well known techniques. In the first parasitic extraction, a solid metal layer is included above the last metal layer used by the ASIC core 100. In this example, the last metal layer used by the ASIC core 100 is the fourth metal layer 110, and the included solid metal layer is the fifth metal layer 302 in FIG. 3.

A delay calculation is performed according to well known techniques on the first parasitic extraction format file 404 to generate the first standard delay format input file 408 containing the delay arcs for the ASIC core 100 and the assumed fifth metal layer 302. The first standard delay format input file 408 contains the timing information for the ASIC core 100 that includes the capacitance contributed by the assumed fifth metal layer 302. Because the assumed fifth metal layer 302 contributes the maximum possible capacitance for any ASIC design, the delay arcs in the standard delay format input file 408 are the longest delays possible for the ASIC core 100 in any ASIC design.

A second parasitic extraction is performed on the core netlist 402 to generate the second parasitic extraction format file 406 in a manner similar to that described above, except that in the second parasitic extraction, an empty fifth metal layer 302 is included above the last metal layer used by the ASIC core 100.

The second parasitic extraction format file 406 is used to generate the second standard delay format input file 410 containing the delay arcs for the ASIC core 100 and the assumed fifth metal layer 302. The second standard delay format input file 410 contains the timing information for the ASIC core 100 that includes the capacitance contributed by the assumed fifth metal layer 302. Because the assumed fifth metal layer 302 contributes the minimum possible capacitance for any ASIC design, the delay arcs in the standard delay format input file 410 are the shortest delays possible for the ASIC core 100 in any ASIC design.

The first standard delay format input file 408 and the second standard delay format input file 410 are then merged into the standard delay format output file 412 by selecting the longest timing value for each delay arc in the first standard delay format input file 408 as the maximum timing value of the corresponding delay arc in the standard delay format output file 412. Similarly, the shortest timing value for each delay arc in the second standard delay format input file 410 is selected as the minimum timing value of the corresponding delay arc in the standard delay format output file 412. The standard delay format output file 412 contains delay arcs for the ASIC core 100 that include the worst, or longest, timing values from the first standard delay format input file 408 and the best, or shortest, timing values from the second standard delay format input file 410. The worst case timing performance for the ASIC core 100 may then be determined from the standard delay format output file 412 by static timing analysis according to well known techniques.

FIG. 5 is a flowchart of the method illustrated in FIG. 4 that may be embodied in a computer program and implemented by a computer according to well known programming techniques.

Step 502 is the entry point for the flowchart 500.

In step 504, a netlist for an ASIC core is received as input.

In step 506, a first parasitic extraction is performed and a first standard parasitic extraction format file is generated for a solid metal layer over the core.

In step 508, a second parasitic extraction is performed and a second standard parasitic extraction format file is generated for an empty metal layer over the core.

In step 510, a delay calculation is performed on the first standard parasitic extraction format file to generate a first standard delay format input file.

In step 512, a delay calculation is performed on the second standard parasitic extraction format file to generate a second standard delay format input file.

In step 514, a longest timing value for each delay arc is selected from the first standard delay format input file.

In step 516, the longest timing value is inserted for each delay arc selected from the first standard delay format input file into the maximum timing value of each corresponding delay arc of the standard delay format output file.

In step 518, the shortest timing value is selected for each delay arc from the second standard delay format input file.

In step 520, the shortest timing value is inserted for each delay arc selected from the second standard delay format file into the minimum timing value of each corresponding delay arc of the standard delay format output file.

In step 522, the selected minimum and maximum timing values of each corresponding delay arc of the output file is generated as output in a standard delay format file.

Step 524 is the exit point for the flowchart 500.

The standard delay format file 412 generated as described above may be used advantageously with static timing analysis software to evaluate the worst case timing performance for an ASIC core in any ASIC design.

Although the flowchart 500 has been described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A method of characterizing worst case timing performance comprising the steps of:
   receiving as input a netlist of a core;
   performing a parasitic extraction on the netlist to generate a first standard parasitic extraction format file for a first assumed top metal layer over the core;
   performing a parasitic extraction on the netlist to generate a second standard parasitic extraction format file for a second assumed top metal layer over the core;
   calculating a minimum timing value from each delay arc of the first standard parasitic extraction format file;
   calculating a maximum timing value from each delay arc of the second standard parasitic extraction format file; and
   merging the minimum timing value calculated from each delay arc of the first standard parasitic extraction format file and the maximum timing value of each delay arc calculated from the second standard parasitic extraction format file to generate an output file.

2. The method of claim 1 wherein the first assumed top metal layer is a solid metal layer.

3. The method of claim 1 wherein the second assumed top metal layer is an empty metal layer.

4. The method of claim 1 further comprising the step of performing a delay calculation on the first standard parasitic extraction format file to generate a first standard delay format file.

5. The method of claim 1 further comprising the step of performing a delay calculation on the second standard parasitic extraction format file to generate a second standard delay format file.

6. The method of claim 1 further comprising the step of selecting a longest timing value for each delay arc from the first standard delay format file.

7. The method of claim 1 further comprising the step of inserting the longest timing value for each delay arc from the first standard delay format file into the maximum timing value of each corresponding delay arc of the output file.

8. The method of claim 1 further comprising the step of selecting a shortest timing value for each delay arc from the second standard delay format file.

9. The method of claim 1 further comprising the step of inserting the shortest timing value for each delay arc from the second standard delay format file into the minimum timing value of each corresponding delay arc of the output file.

10. The method of claim 1 wherein the output file is in standard delay format.

11. A method of characterizing worst case timing performance comprising the steps of:
    receiving as input a netlist of a core;
    performing a parasitic extraction on the netlist to generate a first standard parasitic extraction format file for a first assumed top metal layer over the core;
    performing a parasitic extraction on the netlist to generate a second standard parasitic extraction format file for a second assumed top metal layer over the core;
    performing a delay calculation on the first standard parasitic extraction format file to generate a first standard delay format file;
    performing a delay calculation on the second standard parasitic extraction format file to generate a second standard delay format file;
    selecting a longest timing value for each delay arc from the first standard delay format file;
    inserting the longest timing value for each delay arc from the first standard delay format file into a maximum timing value of each corresponding delay arc of an output file;
    selecting a shortest timing value for each delay arc from the second standard delay format file;
    inserting the shortest timing value for each delay arc from the second standard delay format file into a minimum timing value of each corresponding delay arc of the output file; and
    generating as output the minimum timing value and the maximum timing value of each corresponding delay arc of the output file in standard delay format.

12. The method of claim 11 wherein the first assumed top metal layer is a solid metal layer.

13. The method of claim 11 wherein the second assumed top metal layer is an empty metal layer.

14. A computer program product comprising:
    a medium for embodying a computer program for input to a computer; and
    a computer program embodied in the medium for causing the computer to perform at least one of the following functions:
    receiving as input a netlist of a core;
    performing a parasitic extraction on the netlist to generate a first standard parasitic extraction format file for a first assumed top metal layer over the core;
    performing a parasitic extraction on the netlist to generate a second standard parasitic extraction format file for a second assumed top metal layer over the core;
    selecting a longest timing value for each delay arc from the first standard delay format file;

inserting the longest timing value for each delay arc from the first standard delay format file into a maximum timing value of each corresponding delay arc of an output file;

selecting a shortest timing value for each delay arc from the second standard delay format file;

inserting the shortest timing value for each delay arc from the second standard delay format file into a minimum timing value of each corresponding delay arc of the output file; and generating as output the minimum timing value and the maximum timing value of each corresponding delay arc of the output file in standard delay format.

15. The computer product of claim 14 wherein the assumed top metal layer is a solid metal layer over the core.

16. The computer product of claim 14 wherein the assumed top metal layer is an empty metal layer.

* * * * *